United States Patent
Tomita et al.

(10) Patent No.: US 7,582,184 B2
(45) Date of Patent: Sep. 1, 2009

(54) PLASMA PROCESSING MEMBER

(75) Inventors: Yasumitsu Tomita, Handa (JP);
Hideyoshi Tsuruta, Tokai (JP)

(73) Assignee: NGK Insulators, Ltd., Nagoya-shi (JP)

(*) Notice: Subject to any disclaimer, the term of this patent is extended or adjusted under 35 U.S.C. 154(b) by 70 days.

(21) Appl. No.: 11/361,177

(22) Filed: Feb. 24, 2006

(65) Prior Publication Data
US 2006/0191879 A1 Aug. 31, 2006

(30) Foreign Application Priority Data
Feb. 25, 2005 (JP) ............... 2005-052085

(51) Int. Cl.
*H01L 21/3065* (2006.01)
*C23C 16/50* (2006.01)
*C23C 16/503* (2006.01)
*C23C 16/509* (2006.01)
*C23C 16/46* (2006.01)

(52) U.S. Cl. ............... 156/345.43; 156/345.44; 156/345.47; 156/345.52; 118/723 E; 118/725; 315/111.21

(58) Field of Classification Search ...................
156/345.43–345.47, 345.52; 118/715, 723 E, 118/725; 219/121.47; 315/111.21
See application file for complete search history.

(56) References Cited

U.S. PATENT DOCUMENTS

| | | | | |
|---|---|---|---|---|
| 5,478,429 A | * | 12/1995 | Komino et al. | 156/345.44 |
| 6,617,514 B1 | * | 9/2003 | Ushikoshi et al. | 174/84 R |
| 2004/0027781 A1 | * | 2/2004 | Hanawa et al. | 361/234 |
| 2005/0264219 A1 | * | 12/2005 | Dhindsa et al. | 315/111.21 |
| 2006/0191879 A1 | * | 8/2006 | Tomita et al. | 219/121.47 |
| 2006/0280875 A1 | * | 12/2006 | Tomita et al. | 427/488 |

FOREIGN PATENT DOCUMENTS

| JP | 11-026192 | * | 1/1999 |
|---|---|---|---|
| JP | 11-026192 A1 | | 1/1999 |

* cited by examiner

*Primary Examiner*—Jeffrie R Lund
(74) *Attorney, Agent, or Firm*—Burr & Brown

(57) ABSTRACT

A plasma processing member includes a ceramic base, a plasma generating electrode embedded in the ceramic base, and an electrode power supply member connected to the plasma generating electrode. The impedance of the plasma processing member when plasma is generated using high frequency power at a frequency higher than 13.56 MHz is adjusted to 25Ω or less.

2 Claims, 5 Drawing Sheets

FIG.6

| | Power Supply Member | | | Inductance [nH] | Impedance [ohm] | Plasma (27 MHz) |
|---|---|---|---|---|---|---|
| | Shape | Width [mm] | Length/Width | | | |
| Example 2 | Column | 4.0 | 5.0 | 53.4 | 6.7 | ○ |
| Example 3 | Column | 8.0 | 16.3 | 164.4 | 24.1 | ○ |
| Example 4 | Column | 30.0 | 4.3 | 130.0 | 19.2 | ○ |
| Example 5 | Column | 75.0 | 1.7 | 99.2 | 15.4 | ○ |
| Example 6 | Hollow Shape | 8.0 | 16.3 | 155.7 | 23.3 | ○ |
| Example 7 | Rectangular Column | 8.0 | 16.3 | 151.2 | 20.2 | ○ |
| Comparative Example 2 | Column | 4.0 | 57.5 | 345.6 | 50.3 | × |
| Comparative Example 3 | Column | 4.0 | 32.5 | 180.3 | 26.9 | × |

PLASMA PROCESSING MEMBER

CROSS REFERENCE TO RELATED APPLICATIONS

This application is based upon and claims the benefit of priority from prior Japanese Patent Application No. P2005-052085, filed on Feb. 25, 2005; the entire contents of which are incorporated herein by reference.

BACKGROUND OF THE INVENTION

1. Field of the Invention

The present invention relates to a plasma processing member.

2. Description of the Related Art

In a semiconductor manufacturing process, a liquid crystal manufacturing process, and the like, a processing object such as a semiconductor substrate or a liquid crystal substrate is hitherto subjected to processing using plasma. In a plasma processing apparatus performing such plasma processing, a plasma processing member including a plasma generating electrode embedded in a ceramic base is used (for example, see Japanese Patent Laid-open Publication No. 11-26192). The plasma processing member generates plasma between the plasma processing member and an upper electrode placed in a reaction vessel. The upper electrode is supplied with high frequency power at 13.56 MHz.

In recent years, there is a demand for an increase in frequency of the high frequency power used for generating plasma. In the conventional plasma member with the plasma generating electrode embedded in the ceramic base, however, when the frequency of the used high frequency power was increased to 27 MHz, plasma was not generated in a proper place where the plasma should be generated and was generated in a place different from the target.

Specifically, the state where plasma is generated between the upper electrode and the plasma processing member is normal. When the frequency of the used high frequency power is higher, however, plasma is nonuniformly generated in places different from the target such as between the upper electrode and the inner wall surface of the reaction vessel and under the plasma processing member.

SUMMARY OF THE INVENTION

An object of the present invention is to, in a plasma processing member with a plasma generating electrode embedded in a ceramic base, normally generate plasma between an upper electrode and a plasma processing member even when frequency of used high frequency power is increased.

The inventors made original measurements and found that plasma was nonuniformly generated because impedance of the plasma processing member was higher than that between the upper electrode and a wall of the reaction vessel. Concretely, in the plasma processing apparatus, the impedance between the upper electrode and the reaction vessel measured 30Ω by an impedance analyzer in a state where a plasma generating electrode of the plasma processing member was not connected to a high frequency power supply or ground and was electrically opened. The impedance of the plasma processing member measured 20Ω when high frequency power at 13.56 MHz was applied thereto, which was less than 30Ω. However, when high frequency power at 27 MHz was applied thereto, the impedance of the plasma processing member measured 48Ω, which was not less than 30Ω.

This resulted in the finding that, to normally generate plasma between the upper electrode and the plasma processing member when using high frequency power at a high frequency exceeding 13.56 MHz, such as 27 MHz, the impedance between the upper electrode and the wall of the reaction vessel needed to be higher than the impedance of the plasma processing member.

One of countermeasures therefor is a method in which the distance between the wall of the reaction vessel and the upper electrode or plasma processing member is increased to ensure enough space therebetween and increase the impedance between the upper electrode and the wall of the reaction vessel. However, in the method of increasing the distance between the wall of the reaction vessel and the upper electrode or plasma processing member, the reaction vessel increases in size, and the apparatus cannot be expected to be miniaturized. Moreover, space inside the reaction vessel is widened, and supply of processing gas is increased, thus lowering a manufacturing efficiency. Increasing the size of the reaction vessel is therefore not preferable. Space between the wall of the reaction vessel and each of the upper electrode and plasma processing member was restricted, and the impedance between the upper electrode and the wall of the reaction vessel is difficult to increase.

As means to solve the problem, the inventors examined, not the aforementioned method, a method of reducing the impedance of the plasma processing member. The inventors measured the impedance of the plasma processing member by the impedance analyzer and found that the impedance of the plasma processing member was greatly influenced by inductance of an electrode power supply member connected to the plasma generating electrode. Concretely, for the impedance when using high frequency power at a high frequency exceeding 13.56 MHz, the influence by the inductance of the electrode power supply member was found to account for about 90%. The inventors have completed the present invention based on these findings.

Specifically, a plasma processing member according to the present invention includes: a ceramic base; a plasma generating electrode embedded in the ceramic base; and an electrode power supply member connected to the plasma generating electrode. The impedance of the plasma processing member is not more than 25Ω when plasma is generated using high frequency power at a frequency higher than 13.56 MHz. The electrode power supply member is connected to the plasma generating electrode and supplies the plasma generating electrode with power or grounds the plasma generating electrode.

With the above plasma processing member, the impedance when plasma is generated using high frequency power at a frequency higher than 13.56 MHz is reduced to 25Ω or less although the plasma processing member includes the plasma generating electrode embedded in the ceramic base. Accordingly, in the plasma processing member with the plasma generating electrode embedded in the ceramic base, plasma can be surely generated between the upper electrode and the plasma processing member even when the used high frequency power has a high frequency exceeding 13.56 MHz.

Preferably, the electrode power supply member has an inductance of not more than 150 nH when plasma is generated using high frequency power at a frequency higher than 13.56 MHz. This can properly and easily reduce the impedance of the plasma processing member.

Preferably, width of the electrode power supply member is not less than 4 mm. This can properly reduce the inductance of the electrode power supply member and properly reduce the impedance of the plasma processing member.

Preferably, length of the electrode power supply member is not more than 550 mm. This can properly reduce the inductance of the electrode power supply member and properly reduce the impedance of the plasma processing member.

Preferably, a ratio of the length to the width of the electrode power supply member is 0.03 to 16.3. This can properly reduce the inductance of the electrode power supply member and properly reduce the impedance of the plasma processing member. Furthermore, such a plasma processing member can be applied to various apparatus configurations.

Preferably, the electrode power supply member is hollow. Most of high frequency current flows only in the surface of the electrode power supply member because of the skin effect. Moreover, the inside of the electrode power supply member is not affected by a magnetic field, and the characteristics thereof do not change even when the electrode power supply member is hollow. Moreover, the electrode power supply member being hollow allows space inside the electrode power supply member to be freely used. Furthermore, the electrode power supply member can be reduced in weight, and load on a connecting portion of the electrode power supply member and the plasma generating electrode can be reduced.

Preferably, the plasma generating electrode and the electrode power supply member are connected to each other by caulking, welding, brazing, soldering, fitting, or screwing.

Preferably, the plasma processing member further includes a protection member joined to the ceramic base and provided with a housing portion which accommodates at least a part of the electrode power supply member. In this case, at least a part of the electrode power supply member can be accommodated in the protection member. By accommodating the electrode power supply member in the protection member joined to the ceramic base as described above, the electrode power supply member or the connecting portion of the electrode power supply member and the plasma generating electrode can be protected. The electrode power supply member or the connecting portion of the electrode power supply member and the plasma generating electrode can be therefore prevented from being corroded by plasma or corrosive gas.

Preferably, the electrode power supply member includes: a body portion connected to the plasma generating electrode and accommodated in the protection member; and an external connecting portion joined to the body portion and extended out of the protection member. The position where the plasma generating electrode and body portion are connected to each other and a placement position of the external connecting portion can be freely selected without being restricted by each other, thus allowing a flexible apparatus design.

The plasma processing member can further include: a resistance heating element embedded in the ceramic base; a heating element power supply member connected to the resistance heating element; and an insulating member including a housing portion accommodating the heating element power supply member.

The above plasma processing member can perform a heat treatment for a processing object during processing with plasma. Moreover, since the heating element power supply member is accommodated in the insulating member, the heating element power supply member can be prevented from being electrically affected by the electrode power supply member. It is therefore possible to prevent arcing generated between the electrode power supply member and the heating element power supply member.

In this case, a passage hole through which the insulating member is passed can be formed in the electrode power supply member. The heating element power supply member can be therefore inserted into the electrode power supply member when the heating element is electrically shielded with the insulating member. Even when the plasma processing member includes both the electrode power supply member and heating element power supply member, space needed to place the electrode power supply member and heating element power supply member can be made small. It is therefore possible to prevent an increase in apparatus size of the plasma processing member.

As described above, according to the present invention, in the plasma processing member with the plasma generating electrode embedded in the ceramic base, plasma can be generated between the upper electrode and the plasma processing member even when the frequency of used high frequency power is increased.

BRIEF DESCRIPTION OF THE DRAWINGS

FIG. 6 shows results of Examples.

DETAILED DESCRIPTION OF THE EMBODIMENTS

Figure 1:
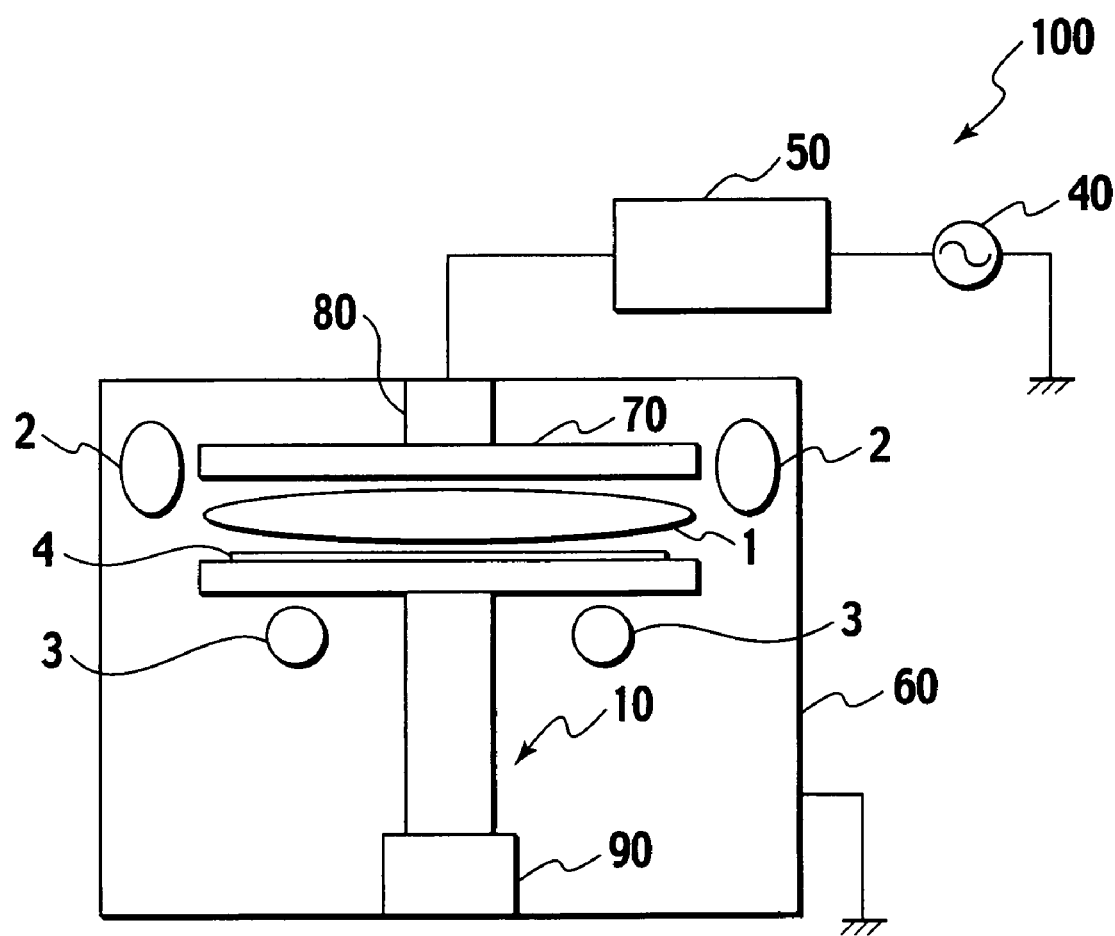
FIG. 1 is a view showing a plasma processing apparatus according to an embodiment of the present invention.

As shown in FIG. 1, a plasma processing apparatus 100 includes a plasma processing member 10, a support table 90, an upper electrode 70, a holder member 80, a reaction vessel 60, an impedance matching box 50, and a high frequency power supply 40. The plasma processing apparatus 100 performs various types of processing using plasma for a processing object 4. The plasma processing apparatus 100 can perform, for example, plasma chemical vapor deposition (CVD), plasma etching, sputtering, and the like. Examples of the processing object 4 are substrates such as a semiconductor substrate and a liquid crystal substrate.

The plasma processing is performed within the reaction vessel 60. In the reaction vessel 60, for example, halogen-based corrosive gas such as $NF_3$, $ClF_3$, $CF_4$, $CHF$, $SiH_2$, or $Cl_2$, non-corrosive gas such as Ar, $N_2$, $O_2$, $SiH_4$, or TEOS, or the like is introduced.

The upper electrode 70 is placed in upper part within the reaction vessel 60. The upper electrode 70 is held by, for example, the holder member 80, which holds the upper electrode 70. The plasma processing member 10 is placed in lower part within the reaction vessel 60. The plasma processing member 10 is placed on, for example, the support table 90, which supports the plasma processing member 10. The plasma processing member 10 holds the processing object 4 such as the substrate.

The plasma processing member 10 generates plasma 1 between the plasma processing member 10 and the upper electrode 70. Concretely, high frequency power is supplied from the high frequency power supply 40 through the impedance matching box 50 to the upper electrode 70 to generate the plasma 1 between the plasma processing member 10 and the upper electrode 70.

The impedance matching box 50 matches impedance from the high frequency power supply 40 to the upper electrode 70. Power loss of the high frequency power can be therefore reduced, and the high frequency power can be efficiently transmitted to the upper electrode 70.

The upper electrode 70 is supplied with high frequency power at a frequency higher than 13.56 MHz from the high frequency power supply 40. The plasma processing apparatus 100 can use high frequency power at a frequency higher than 13.56 MHz, for example, such as 27 or 60 MHz. The various types of plasma processing are then performed for the processing object 4 held by the plasma processing member 10. The high frequency power supply 40 and reaction vessel 60 are grounded.

The plasma processing member 10 of the embodiment is configured to have an impedance of 25Ω or less when plasma is generated using high frequency power at a frequency higher than 13.56 MHz. For example, the impedance of the plasma processing member 10 when high frequency power at 27 or 60 MHz, which is higher than 13.56 MHz, is applied to the upper electrode 70 from the high frequency power supply 40 is adjusted to 25Ω or less.

Figure 2A:
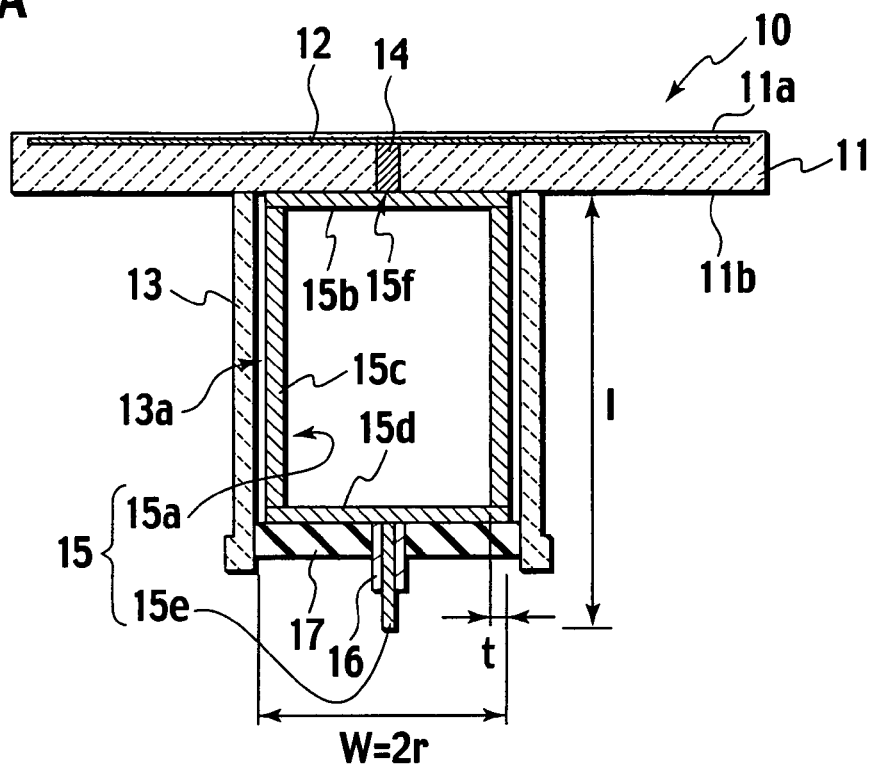
FIG. 2A shows a cross section of a plasma processing member according to the embodiment of the present invention and is a cross-sectional view taken along a line IIA-IIA of FIG. 2B.
Figure 2B:
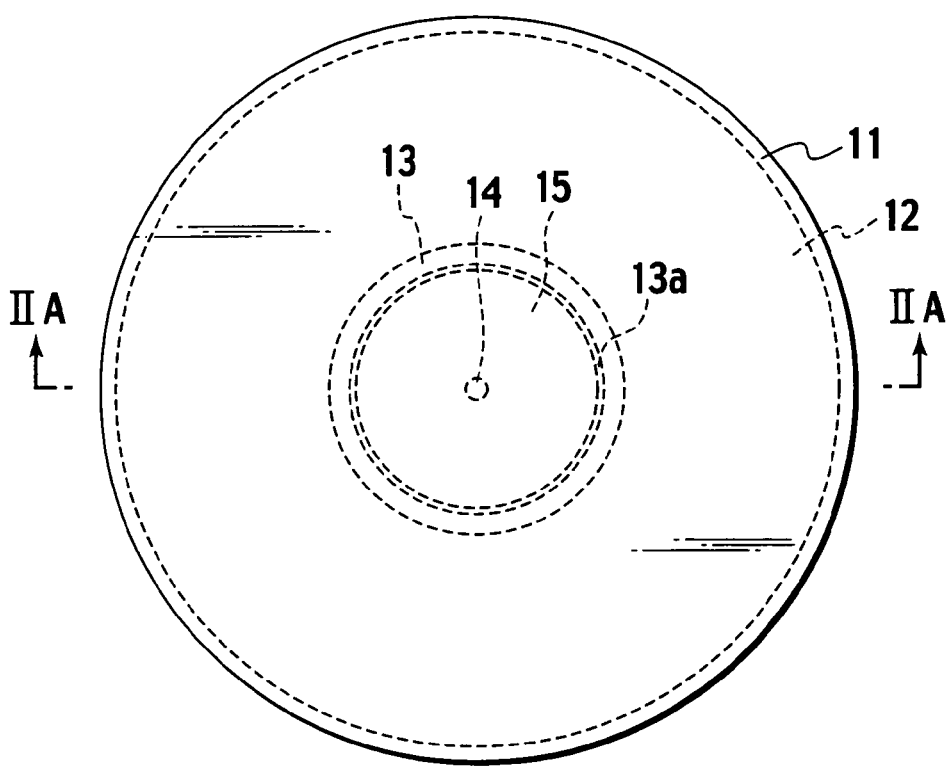
FIG. 2B is a plan view of the plasma processing member according to the embodiment of the present invention.

With the plasma processing member 10 described above, the impedance thereof when plasma is generated using high frequency power at a frequency higher than 13.56 MHz is reduced to 25Ω or less although a plasma generating electrode 12 is embedded in a ceramic base 11 (see FIG. 2A). As shown in FIGS. 1, 2A, and 2B, in the plasma processing member 10 with the plasma generating electrode 12 embedded in the ceramic base 11, accordingly, the plasma 1 can be normally generated between the upper electrode 70 and the plasma processing member 10 even when the frequency of used high frequency power is increased to exceed 13.56 MHz.

Preferably, the impedance of the plasma processing member 10 is 10Ω or less when the plasma 1 is generated using high frequency power at a frequency of 27 MHz or higher.

Next, the plasma processing member 10 is described in detail using FIGS. 2A and 2B. FIGS. 2A and 2B are a cross-sectional view and a plan view of the plasma processing member 10, respectively. The plasma processing member 10 includes the ceramic base 11, the plasma generating electrode 12, an electrode terminal 14, an electrode power supply member 15, a protection member 13, an insulating tube 16, and a sealing member 17.

The ceramic base 11 includes the plasma generating electrode 12 embedded inside. The ceramic base 11 includes a placement surface 11a, on which the processing object 4 is placed. In a rear surface 11b (a surface opposite to the placement surface 11a) of the ceramic base 11, a hole into which the electrode terminal 14 is inserted is formed up to the plasma generating electrode 12. The electrode terminal 14 is inserted in the ceramic base 11.

The ceramic base 11 can be, for example, a disk or rectangular plate. The ceramic base 11 is formed of ceramic such as aluminum nitride (AlN), silicon nitride (SiN), silicon carbide (SiC), alumina ($Al_2O_3$), and SiAlON. Accordingly, the plasma processing member 10 can have increased resistance to heat and corrosion.

The plasma generating electrode 12 is embedded in the ceramic base 11. As shown in FIG. 1, the plasma generating electrode 12 generates the plasma 1 between the plasma generating electrode 12 and the upper electrode 70, which is placed within the reaction vessel 60. The plasma generating electrode 12 can be formed of a conductive material, and the kind thereof is not limited. However, it is preferable that the plasma generating electrode 12 is formed of a conductive high-melting point material. The plasma generating electrode 12 can be formed of a conductive high-melting point material, for example, such as molybdenum (Mo), tungsten (W), molybdenum carbide (MoC), tungsten carbide (WC), tungsten-molybdenum alloy, platinum (Pt), and niobium (Nb).

The form of the plasma generating electrode 12 is not limited, and the plasma generating electrode 12 can be composed of, for example, a material printed with printing paste containing conductive material powder, a plate-shaped or linear bulk body of the conductive material, a sheet (foil) of the conductive material, a thin film of the conductive material formed by CVD or PVD (physical vapor deposition), or the like. Moreover, shape of the plasma generating electrode 12 is also not limited and can be a circle, a hemicycle, a mesh (wire mesh), a comb shape, a perforate shape (punching metal), or the like. Furthermore, the plasma generating electrode 12 may be a monopolar type with a single electrode or a bipolar type with two electrodes or may be separated into more electrodes.

The plasma generating electrode 12 is joined to the electrode terminal 14. The plasma generating electrode 12 and electrode terminal 14 can be joined to each other, for example, by caulking, welding, brazing, soldering, fitting, or the like. Alternatively, the plasma generating electrode 12 and electrode terminal 14 can be joined to each other by forming screw portions in the plasma generating electrode 12 and electrode terminal 14 and screwing the same on each other.

The electrode power supply member 15 is electrically connected to the plasma generating electrode 12 through the electrode terminal 14. The electrode power supply member 15 supplies the plasma generating electrode 12 with power or grounds the plasma generating electrode 12. The electrode power supply member 15 in FIG. 2A grounds the plasma generating electrode 12.

The electrode power supply member 15 and electrode terminal 14 can be joined to each other by, for example, caulking, welding, brazing, soldering, fitting, or the like. Alternatively, the electrode power supply member 15 and electrode terminal 14 can be joined to each other by forming screw portions in the electrode power supply member 15 and electrode terminal 14 and screwing the same on each other.

As described above, the plasma generating electrode 12 and electrode power supply member 15 are connected to each other with the electrode terminal 14 interposed therebetween by use of caulking, welding, brazing, soldering, fitting, screwing, or the like. A part of the electrode power supply member 15 is accommodated in the protection member 13. Another part of the electrode power supply member 15 is accommodated in the insulating tube 16.

The protection member 13 protects the electrode power supply member 15 and supports the ceramic base 11. Concretely, the protection member 13 protects the electrode power supply member 15 from plasma or the corrosive gas introduced into the reaction vessel 60. The protection member 13 is joined to the rear surface 11b of the ceramic base 11. The protection member 13 includes a housing portion 13a accommodating a part of the electrode power supply member 15. Concretely, the protection member 13 is shaped in a tube, and the inside of the tube serves as the housing portion 13*a*, which accommodates the electrode power supply member 15.

The protection member 13 can be formed of, for example, ceramic, metal, or a composite material of ceramic and metal. The protection member 13 can be formed of, for example, ceramic same as the ceramic base 11, a metal material such as aluminum, aluminum alloy, anodized aluminum, or KOVAR, or a composite material such as an aluminum-alumina composite material. Preferably, the protection member 13 is formed of ceramics of the same type as the ceramic base 11.

The sealing member 17 seals the protection member 13 accommodating at least a part of the electrode power supply member 15 and supports the electrode power supply member 15. The sealing member 17 seals the bottom end of the protection member 13 so as to cover the bottom face of the electrode power supply member 15. The sealing member 17 is formed of an insulating material and can be formed of, for example, an insulating material such as ceramic or resin. The sealing member 17 is fixed to an inner circumferential surface of the protection member 13. The sealing member 17 can be fixed to the protection member 13 by, for example, adhesion with an adhesive or brazing. Alternatively, the sealing member 17 can be fixed to the protection member 13 by forming screw portions in the sealing member 17 and protection member 13 and screwing the same on each other. In the sealing member 17, a hole into which the insulating tube 16 is inserted is formed.

As described above, a part of the electrode power supply member 15 is accommodated in the airtight protection member 13 joined to the ceramic base 11. Accordingly, the electrode power supply member 15, a connecting portion between the electrode terminal 14 and the electrode power supply member 15, and a connecting portion between the electrode terminal 14 and the plasma generating electrode 12 can be protected. The electrode power supply member 15 and the portion where the electrode power supply member 15 and the plasma generating electrode 12 are connected with the electrode terminal 14 interposed therebetween can be therefore prevented from being corroded.

Moreover, in the plasma processing member 10, the protection member 13 accommodating the electrode power supply member 15 is sealed by the sealing member 17. This can further increase the airtightness of the protection member 13 and therefore further prevent corrosion of the electrode power supply member 15 and the connecting portion between the electrode power supply member 15 and the plasma generating electrode 12.

Next, the electrode power supply member 15 is described in detail. In the electrode power supply member 15, inductance when plasma is generated using high frequency power at a frequency higher than 13.56 MHz is adjusted to 150 nH or less. This allows the impedance of the plasma processing member 10 to be properly and easily reduced. By adjusting the inductance of the power supply member when plasma is generated using high frequency power at a frequency higher than 13.56 MHz to 150 nH or less, the impedance thereof when plasma is generated using high frequency power at a frequency higher than 13.56 MHz is adjusted to 25Ω or less.

The electrode power supply member 15 includes, for example, as shown in FIG. 2A, a body portion 15*a* connected to the plasma generating electrode 12 and accommodated in the protection member 13 and an external connecting portion 15*e* joined to the body portion 15*a* and extended out of the protection member 13.

The shape of the body portion 15*a* is not limited to a cylinder shown in FIG. 2A and can be a rectangular cylinder, a column, a rectangular column, or the like. It is especially preferable that the electrode power supply member 15 is hollow as shown in FIGS. 2A and 2B. Most of high frequency current flows only in the surface of the electrode power supply member 15 because of the skin effect. Moreover, the inside of the electrode power supply member 15 is not affected by the magnetic field, and the characteristics of the electrode power supply member 15 do not change even when the electrode power supply member 15 is hollow. The electrode power supply member 15 can therefore properly exert a function as a power supply member when current flows in the wall surface thereof (the surface of the body portion 15*a* and the surface of the external connecting portion 15*e* in the case of FIGS. 2A and 2B). Moreover, since the electrode power supply member 15 is hollow, space inside the electrode power supply member 15 can be freely used. Furthermore, the electrode power supply member 15 can be reduced in weight. It is therefore possible to reduce load on the connecting portion between the electrode power supply member 15 and the plasma generating electrode 12. Depending on the material, the weight of the electrode power supply member 15 can be reduced to, for example, 150 g or less. The body portion 15*a* is accommodated in the housing portion 13*a* of the protection member 13.

The external connecting portion 15*e* is a portion to take a part of the electrode power supply member 15 out of the protection member 13. The external connecting portion 15*e* is extended out of the protection member 13 and accommodated in the insulating tube 16.

The electrode power supply member 15 can be formed of a conductive material, the kind of which is not limited. The electrode power supply member 15 can be formed of metal, for example, such as nickel (Ni), KOVAR, or aluminum (Al). It is especially preferable that the electrode power supply member 15 is formed of Al and the like, which can reduce the inductance of the electrode power supply member 15 and thus properly reduce the impedance of the plasma processing member 10.

The form of the electrode power supply member 15 is not limited and, for example, can be a plate-shaped or linear bulk body of the conductive material, a sheet (foil) of the conductive material, a material with a base material of glass, resin, ceramic such as alumina or aluminum nitride, or the like coated with the conductive material by CVD or PVD, a cable of a conductive material, or the like.

For example, a top plate 15*b*, a cylindrical drum portion 15*c*, and a bottom plate 15*d* shown in FIG. 2A are individually formed of a plate, sheet (foil), or mesh (for example, wire mesh) of the conductive material. The top plate 15*b*, cylindrical drum portion 15*c*, and bottom plate 15*d* are then joined to each other by caulking, welding, brazing, soldering, fitting, or the like to form the body portion 15*a* having a hollow shape such as a cylinder or a rectangular cylinder. Alternatively, the top plate 15*b*, cylindrical drum portion 15*c*, and bottom plate 15*d* may be joined by forming screw portions in the top plate 15*b*, cylindrical drum portion 15*c*, and bottom plate 15*d*, screwing the top plate 15*b* and cylindrical drum portion 15*c*, and screwing the bottom plate 15*d* and cylindrical drum portion 15*c*.

Alternatively, the body portion 15*a* shaped in a cylinder or a rectangular cylinder is integrally formed using a plate, sheet, or mesh of the conductive material. Moreover, the hollow body portion 15*a* of a column or a rectangular column may be formed of rod or cable of the conductive material.

The external connecting portion 15e is joined to the bottom portion of the body portion 15a by caulking, welding brazing, soldering, fitting, or the like, thus to form the electrode power supply member 15. Alternatively, the external connecting portion 15e may be joined to the bottom of the body portion 15a by forming screw portions in the bottom of the body portion 15a and external connecting portion 15e and screwing the same on each other. The external connecting portion 15e can be formed of cable or rod of the conductive material.

As described above, the electrode power supply member 15 includes the body portion 15a and external connecting portion 15e. Accordingly, the position of a connecting portion 15f of the body portion 15a which is connected to the plasma generating electrode 12 and the placement position of the external connecting portion 15e can be freely selected without being restricted by each other, thus allowing a flexible apparatus design in the plasma processing member 10. For example, the connecting portion 15f and external connecting portion 15e may be disposed so as to be positioned on a same axis as shown in FIG. 2A or may be disposed on different axes so as not to be positioned on the same axis. For example, in the case of a rod-shaped power supply member, the position where the power supply member is connected to the plasma generating electrode and the position of a portion of the power supply member taken out are limited to on the same axis. In some cases, the limitation of the position where the portion of the power supply member is taken out in the reaction vessel 60 restricts the position where the power supply member and plasma generating electrode are connected. However, the electrode power supply member 15 including the body portion 15a and external connecting portion 15e is not restricted in such a manner, and a flexible apparatus design can be achieved.

Preferably, width w of the electrode power supply member 15 is 4 mm or more. Concretely, the width w of the widest portion of the electrode power supply member 15 is set to 4 mm or more. For example, in the case of the cylinder shown in FIG. 2A or a solid cylinder, the width w of the electrode power supply member 15 corresponds to diameter 2r (r=radius) thereof. Accordingly, the diameter 2r of the electrode power supply member 15 is set to 4 mm or more.

By increasing the width w (diameter 2r) of the electrode power supply member 15 to 4 mm or more, the inductance of the electrode power supply member 15 can be properly reduced, and the impedance of the plasma processing member 10 can be properly reduced.

Preferably, the width w (diameter 2r) of the electrode power supply member 15 is 330 mm or less. When the width w (diameter 2r) of the electrode power supply member 15 is 330 mm or less, the electrode power supply member 15 can be within the outer circumference of the ceramic base 11, thus preventing an increase in apparatus size.

Preferably, length of the electrode power supply member is 550 mm or less. Concretely, length l of the longest portion of the electrode power supply member 15 is set to 550 mm or less. The length l of the longest portion of the electrode power supply member 15 is length between the upper surface of the body portion 15a and the end surface of the external connecting portion 15e. When the length l of the electrode power supply member 15 is set to 550 mm or less, the inductance of the electrode power supply member 15 can be properly reduced, and the impedance of the plasma processing member 10 can be properly reduced.

Preferably, the length l of the electrode power supply member 15 is 50 mm or more. Setting the length of the electrode power supply member 15 to 50 mm or more allows a certain distance to be provided between the connecting portion 15f of the electrode power supply member 15 and the opposite end, in other words, between the end of the external connecting portion 15e and the ceramic base 11. It is therefore possible to provide a certain distance between the ceramic base 11 and the bottom of the reaction vessel 60 and thus reduce the influence of the reaction vessel 60 on the ceramic base 11.

The width w (diameter 2r) of the electrode power supply member 15 is more preferably 20 to 80 mm. The length l of the electrode power supply member 15 is more preferably 50 to 300 mm.

When a part of the electrode power supply member 15 is accommodated in the protection member 13 as shown in FIGS. 2A and 2B, it is preferable that the width w (2r) and length l of the electrode power supply member 15 is determined in consideration of the shape and size of the protection member 13. In some cases, the size of the protection member 13 is restricted by the apparatus configuration of the plasma processing apparatus 100, such as size of the reaction vessel 60, or restricted in order to reduce stress concentration due to thermal stress, especially, stress concentration at the joint of the protection member 13 and ceramic base 11. For example, in order to reduce the stress concentration and ensure the joint area between the electrode power supply member 15 and the plasma generating electrode 12, preferably, the protection member 13 has a diameter of 20 to 80 mm and a length of 130 to 300 mm.

In this case, in order to accommodate a part of the electrode supply member 15 in the protection member 13 and take another part of the electrode supply member 15 out of the protection member 13, the length of the entire electrode power supply member 15, that is, the length l between the upper end of the body portion 15a and the lower end of the external connecting portion 15e, needs to be longer than the protection member 13. Preferably, the width w (diameter 2r) of the electrode power supply member 15 is set so as to reduce the inductance and reduce the impedance instead of the length l of the electrode power supply member 15 restricted by the protection member 13 and so as to allow the body portion 15a to be accommodated in the protection member 13.

Moreover, when a part of the electrode power supply member 15 is either accommodated in the protection member 13 or not accommodated therein, the width w (2r) and length l of the electrode power supply member 15 can be determined in consideration of, for example, the size and shape of the ceramic base 11.

Herein, a description is given of the reduction of the impedance using equations. Impedance Z of the plasma processing member 10 can be expressed by the following equation (1). In the equation (1), R is resistance of the plasma processing member 10, C is capacitance of the plasma processing member 10, and L is the inductance of the plasma processing member 10.

$$Z=\{R^2+[\omega \times L-(1/\omega \times C)]^2\}^{1/2} \qquad \text{Equation (1)}$$

Herein, $\omega=2\pi f$ (f: frequency of high frequency power)

When the frequency f of the used high frequency power is higher, the impedance Z of the plasma processing member 10 is affected by the inductance L more than by the capacitance C. Accordingly, the impedance Z can be reduced by reducing the inductance L of the plasma processing member 10.

The inductance L of the plasma processing member 10 is greatly affected by the inductance L1 of the electrode power supply member 15. Herein, the explanation is given taking as an example a case where the electrode power supply member is a cylinder or a column and the width w of the electrode power supply member 15 corresponds to the diameter 2r of the electrode power supply member 15. The inductance L1 of the electrode power supply member 15 is expressed by the sum of internal inductance Li of the electrode power supply member 15 expressed by the following equation (2) and external inductance Le expressed by an equation (3), that is, by an equation (4). In the equations (2) and (3), $\mu_0$ is the vacuum magnetic permeability, and $\mu_s$ is the relative permeability of a conductor.

$$Li = (\mu_0 \times \mu_s \times l)/8\pi \qquad \text{Equation (2)}$$

$$Le = (\mu_0 \times l)/\{2\pi \times [\ln 2l/(r-l)]\} \qquad \text{Equation (3)}$$

$$L1 = Li + Le \qquad (4)$$

However, when the frequency of the used high frequency power is high, the internal inductance Li of the electrode power supply member 15 is 0 because of the skin effect that current mainly flows in the surface of the electrode power supply member 15. The inductance L1 is therefore equal to the external inductance Le. The following equation (5) is established.

$$L1 = Le = (\mu_o \times l)/\{2\pi \times [\ln 2l/(r-l)]\} \qquad (5)$$

Accordingly, the inductance L1 can be reduced by increasing the width w (diameter 2r) of the electrode power supply member 15 and reducing the length l thereof. The impedance of the electrode power supply member 15 can be therefore reduced, and the impedance of the entire plasma processing member 10 can be reduced.

Preferably, a ratio l/w (l/2r) of the length l to the width w (diameter 2r) of the electrode power supply member 15 is 0.03 to 16.3. This can properly reduce the inductance of the electrode power supply member 15 and properly reduce the impedance of the plasma processing member 10. Furthermore, the electrode power supply member 15 can be applied to various types of apparatus configurations. For example, the support table 90 can have various shapes, and the electrode power supply member 15 can have a practical shape.

Furthermore, when the electrode power supply member 15 is hollow as shown in FIG. 2A, preferably, thickness t of the body portion 15a, which is hollow, is 0.05 to 5.0 mm. This can ensure sufficient flexibility of the hollow portion without affecting the characteristics as the power supply member.

By adjusting the material, width w (2r), length l, and the like of the electrode power supply member 15 as described above, the inductance thereof when plasma is generated using high frequency power at a frequency higher than 13.56 MHz can be reduced to 150 nH or less. Accordingly, the impedance of the electrode power supply member 15 when high frequency power at a frequency higher than 13.56 MHz is used can be reduced to 25Ω or less, and the impedance of the entire plasma processing member 10 when high frequency power at a frequency higher than 13.56 MHz is used can be therefore reduced to 25Ω or less.

Figure 3A:
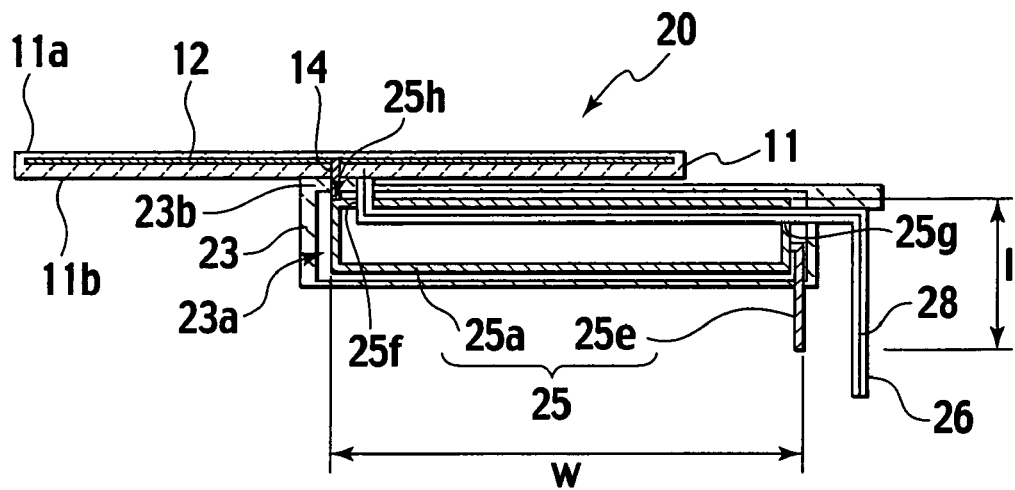
FIG. 3A shows a cross section of another plasma processing member according to the embodiment of the present invention and is a cross-sectional view taken along a line IIIA-IIIA of FIG. 3B.
Figure 3B:
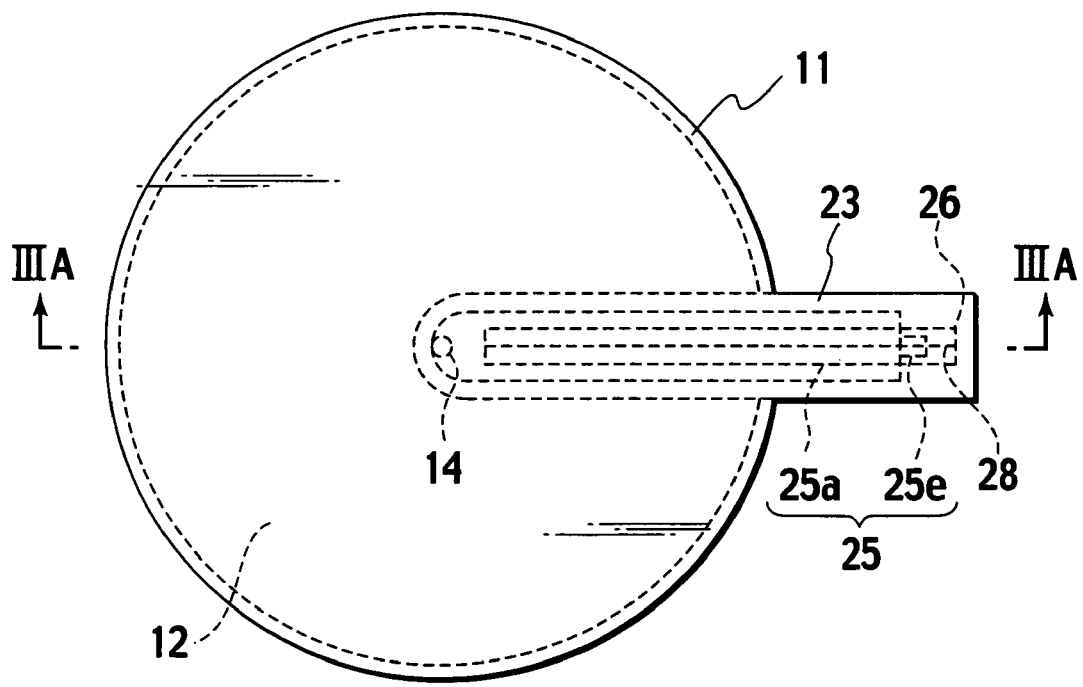
FIG. 3B is a plan view of the another plasma processing member according to the embodiment of the present invention.

The form of the plasma processing member is not limited to that shown in FIGS. 2A and 2B, and the plasma processing member can be a plasma processing member 20 shown in FIGS. 3A and 3B. FIGS. 3A and 3B show a cross-sectional view and a plan view of the plasma processing member 20, respectively. The plasma processing member 20 includes the ceramic base 11, the plasma generating electrode 12, the electrode terminal 14, an electrode power supply member 25, a thermocouple (TC) 28, a protection member 23, and an insulating tube 26. Substantially same portions as those in FIGS. 2A and 2B are given same reference numerals, and a description thereof is omitted.

The protection member 23 has an arm shape and laterally extends from the center of the ceramic base 11 in parallel to the ceramic base 11. The protection member 23 is hollow, and the hollow portion serves as a housing portion 23a, which accommodates a part of the electrode power supply member 25. The protection member 23 is joined to the rear surface 11b of the ceramic base 11. The protection member 23 includes a joint portion 23b in the upper surface, the joint portion 23b being joined to the ceramic base 11. In the joint portion 23b, a hole to which the electrode terminal 14 is inserted is formed. The electrode terminal 14 is inserted in the hole of the joint portion 23b and extended up to the housing portion 23a of the protection member 23. Furthermore, in the protection member 23, passage holes through which the insulating tube 26 is passed is formed. Concretely, the passage holes are individually formed in the joint portion 23b and the side wall of the protection member 23. In the protection member 23, a hole into which the electrode power supply member 25 is inserted is formed to take a part of the electrode power supply member 25 out of the protection member 23.

The electrode power supply member 25 includes a hollow body portion 25a connected to the plasma generating electrode 12, and an external connecting portion 25e joined to the body portion 25a. The body portion 25a is accommodated in the housing portion 23a of the protection member 23. The external connecting portion 25e is extended out of the protection member 23 in order to take a part of the electrode power supply member 25 out of the protection member 23. The external connecting portion 25e is inserted into the protection member 23 and extended out of the protection member 23.

Since the electrode power supply member 25 includes the body portion 25a and the external connecting portion 25e, a position of a connecting portion 25h of the body portion 25a, which is connected to the plasma generating electrode 12, a placement position of the external connecting portion 25e can be freely selected without being restricted by each other. The connecting portion 25h and external connecting portion 25e can be therefore disposed on different axes as shown in FIGS. 3A and 3B so as not to be positioned on a same axis.

In the electrode power supply member 25, passage holes 25f and 25g through which the insulating tube 26 is passed are formed in upper part and the side wall of the body portion 25a. The insulating tube 26 is passed through the hollow portion of the electrode power supply member 25. Concretely, the insulating tube 26 is inserted through the passage hole 25f, laterally extended in the hollow portion of the body portion 25a, inserted into the passage hole 25g, and extended out of the protection member 23. The electrode power supply member 26 being hollow facilitates the passage of the thermocouple 28 and insulating tube 26, and the hollow portion can be effectively used.

The electrode power supply member 25 can be configured in a same way as the electrode power supply member 15 shown in FIGS. 2A and 2B other than the above described points. The width w of the widest part of the electrode power supply member 25 is width between the end surface of the body portion 25a and the side surface of the external connecting portion 25e. The length l of the longest part of the electrode power supply member 25 is length between the upper surface of the body portion 25a and the end surface of the external connection member 25e.

The insulating tube 26 accommodates the thermocouple 28 inside and electrically shields the thermocouple 28 from the electrode power supply member 25. In the ceramic base 11, a hole to which the thermocouple 28 is inserted is formed. The thermocouple 28 measures temperature of the ceramic base 11. The thermocouple 28 is inserted into the ceramic base 11 and accommodated in the insulating tube 26. Instead of the thermocouple 28, temperature measuring means such as a resistance thermometer may be used.

Figure 4:
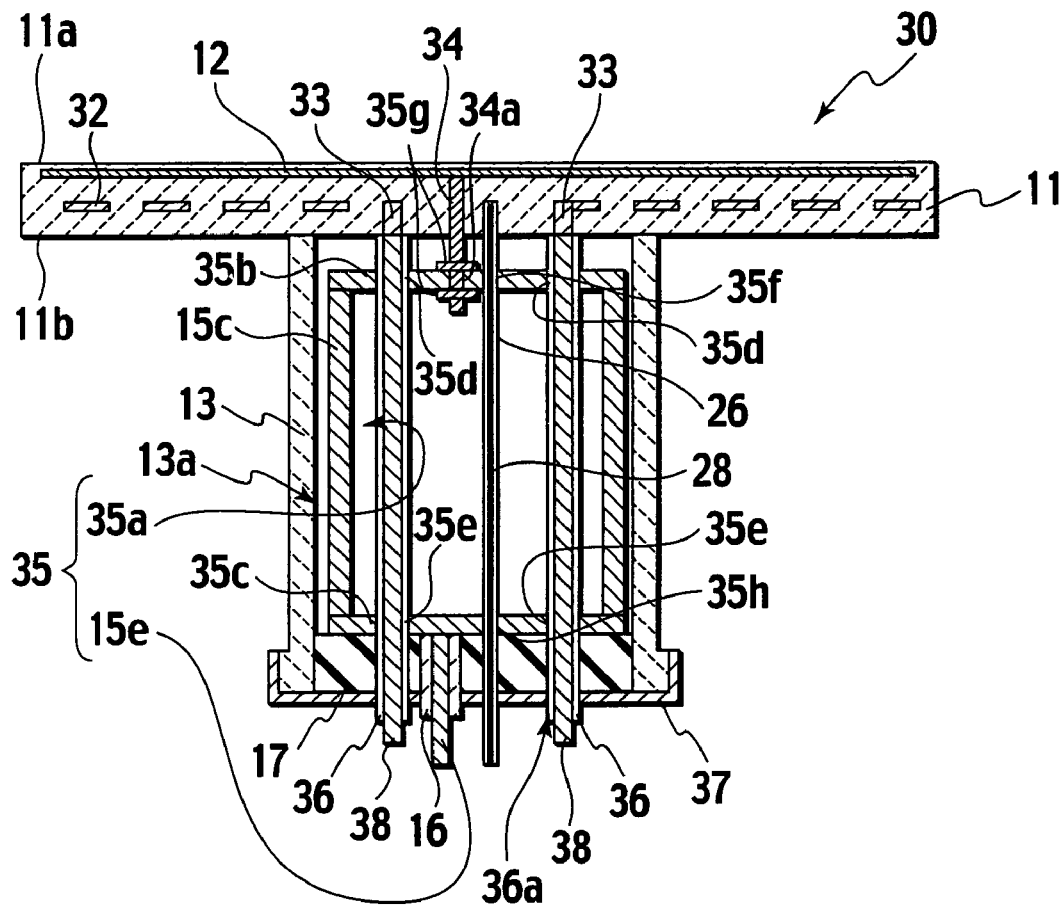
FIG. 4 is a cross-sectional view showing still another plasma processing member according to the embodiment of the present invention.

Furthermore, the plasma processing member of the embodiment can be a plasma processing member 30 including a resistance heating element 32 shown in FIG. 4. The plasma processing member 30 includes the ceramic base 11, the plasma generating electrode 12, an electrode terminal 34, a nut 34a, an electrode power supply member 35, the resistance heating element 32, a heating element terminal 33, a heating element power supply member 38, the protection member 13, an insulating tube 16, an insulating member 36, the sealing member 17, a cover member 37, the thermocouple 28, and the insulating tube 26. Herein, substantially same portions as those of FIGS. 2A and 2B or FIGS. 3A and 3B are given same reference numerals, and a description thereof is omitted.

The resistance heating element 32 is embedded in the ceramic base 11. The resistance heating element 32 is supplied with power from the heating element power supply member 38 to generate heat. The resistance heating element 32 is joined to the heating element terminal 33. The resistance heating element 32 and heating element terminal 33 can be joined to each other, for example, by caulking, welding, brazing, soldering, fitting, or the like. Alternatively, the resistance heating element 32 and heating element terminal 33 can be joined by forming screw portions in the resistance heating element 32 and heating element terminal 33 and screwing the same on each other. In the rear surface 11b of the ceramic base 11, a hole into which the heating element terminal 33 is inserted is formed up to the resistance heating element 32. The heating element terminal 33 is inserted in the ceramic base 11. The resistance heating element 32 is connected to the heating element power supply member 38 through the heating element terminal 33 to be supplied with power.

The resistance heating element 32 can be composed of a high-melting point material, for example, such as molybdenum, tungsten, molybdenum carbide, tungsten carbide, tungsten-molybdenum alloy, platinum, or niobium. The form of the resistance heating element 32 is not limited, and the resistance heating element 32 can be formed of a material formed by printing with printing paste containing powder of the high-melting point material, a plate-like, linear, coil-like, or belt-like bulk body of the high-melting point material, a sheet (foil) of the high-melting point material, a thin film formed by CVD or PVD, or the like.

The pattern shape of the resistance heating element 32 is also not limited and can be a spiral, a mesh, a perforate shape, a shape including a plurality of folded portions, or the like. Furthermore, the resistance generating element 32 may be single or multiple. For example, the resistance heating element 32 may be composed of two separated regions of a center part of the placement surface 11a and a peripheral part thereof. As shown in FIG. 4, the electrode terminal 34 and heating element terminal 33 are formed at different positions so as not to overlap each other. The pattern shape of the resistance heating element 32 can be therefore designed independent of the position of the electrode terminal 34.

The heating element power supply member 38 is connected to the resistance heating element 32. Specifically, the heating element power supply member 38 is connected to the resistance heating element 32 through the heating element terminal 33. The heating element power supply member 38 and heating element terminal 33 can be joined to each other by, for example, caulking, welding, brazing, soldering, fitting, or the like. Alternatively, the heating element power supply member 38 and heating element terminal 32 can be joined by forming screw portions in the heating element power supply member 38 and heating element terminal 33 and screwing the same on each other.

The heating element power supply member 38 is, similar to the electrode power supply member, can be formed of a conductive material, the kind of which is not limited. The form of the heating element power supply member 38 is also not limited, and the heating element power supply member 38 may be formed of a plate-like, linear, or rod-like bulk body of the conductive material, a sheet (foil) of the conductive material, a material with a base material such as ceramic, resin, or glass coated with the conductive material by CVD or PVD, cable of the conductive material, or the like. The heating element power supply member 38 is accommodated in the insulating member 36.

The insulating member 36 accommodates the heating element power supply member 38 inside and electrically shields the heating element power supply member 38 from the electrode power supply member 35. The insulating member 36 includes a housing portion 36a, which accommodates the heating element power supply member 38. When the insulating member 36 is shaped in a tube, for example, the inside of the tube can serve as the housing portion 36a, which accommodates the heating element power supply member 38. In this case, it is preferable that the heating element power supply member 38 is formed of rod or cable of the conductive material. The insulating member 36 can be formed of an insulating material such as ceramic. For example, the entire insulating member 36 may be formed of the insulating material, or the insulating member 36 may be formed by coating a base material with the insulating material. Preferably, the insulating member 36 is formed of, for example, ceramic such as alumina.

The insulating member 36 is joined to the rear surface 11b of the ceramic base 11. The insulating member 36 is passed through the electrode power supply member 35, sealing member 17, and cover member 37.

Figure 5:
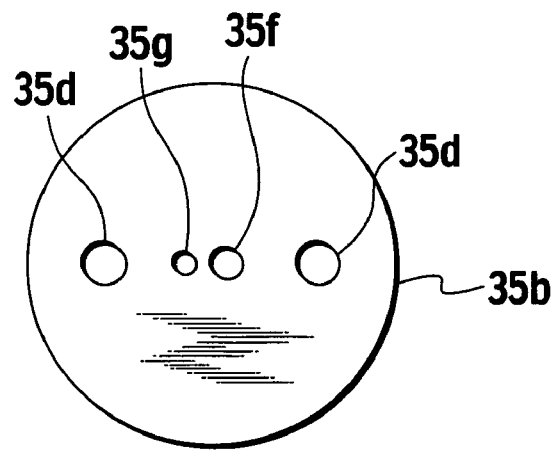
FIG. 5 is a view showing a top panel of the still another plasma processing member according to the present invention.

The electrode power supply member 35 includes a body portion 35a and the external connecting portion 15e. The body portion 35a is substantially the same as the body portion 15a shown in FIGS. 2A and 2B. However, in the body portion 35a, passage holes 35d and 35e, through which the insulating member 36 is passed, are formed. Concretely, the passage holes 35d and 35e are formed in a top plate 35b and a bottom plate 35c of the body portion 35a, respectively, so that the insulating member 36 can penetrate the body portion 35a. As shown in FIG. 5, in the top plate 35b, the passage hole 35d is formed at a position where the insulating member 36 is inserted. Also in the bottom plate 35c, the passage hole 35e is formed at the same position.

Furthermore, in the body portion 35a of the electrode power supply member 35, a hole 35g, into which the electrode terminal 34 is inserted, is formed. Concretely, as shown in FIG. 5, the hole 35g is formed in the top plate 35b of the body portion 35a. The electrode terminal 34 is inserted into the hole 35g of the body portion 35a and fixed to the electrode power supply member 35 with the nut 34a.

Furthermore, in the body portion 35a of the electrode power supply member 35, passage holes 35f and 35h, through which the insulating tube 26 accommodating the thermocouple 28 is passed, are formed. Concretely, the passage holes 35f and 35h are formed in the top plate 35b and bottom plate 35c of the body plate 35a, respectively, so that the insulating tube 26 can penetrate the body portion 35a. As shown in FIG. 5, in the top plate 35b, the passage hole 35f is formed at a position where the insulating tube 26 is inserted. Also in the bottom plate 35c, the passage hole 35h is formed at the same position. The insulating tube 26 is joined to the rear surface 11b of the ceramic base 11. The insulating tube 26 is passed through the electrode power supply member 35, sealing member 17, and cover member 37.

The electrode power supply member 35 being hollow as described above facilitates the passage of the heating element power supply member 38, insulating member 36, thermocouple 28, and insulating tube 26 through the electrode power supply member 35, and the hollow portion can be effectively used.

Furthermore, since the electrode power supply member 15 includes the body portion 35a and external connecting portion 15e, the position (position of the hole 35g) where the plasma generating electrode 12 is connected to the body portion 35a and the placement position of the external connecting portion 15e can be freely selected without being restricted by each other. Accordingly, a flexible apparatus design can be achieved in the plasma processing member 30. For example, as shown in FIG. 4, the position (position of the hole 35g) where the plasma generating electrode 12 is connected to the body portion 35a and the placement position of the external connecting portion 15e can be individually placed on different axes so as not to be located on a same axis. For example, in the case of a rod-shaped power supply member, the position where the plasma generating electrode is connected to the power supply member and the position of a portion of the power supply member taken out are limited to on the same axis. In some cases, the limitation of the placement position of the portion of the power supply member taken out restricts the position where the power supply member is connected to the plasma generating electrode. However, with the electrode power supply member 35, which includes the body portion 35a and the external connecting portion 15e, a flexible apparatus design can be achieved without such restriction. Especially in the case of the plasma processing member 30 including the resistance heating element 32, the position where the plasma generating electrode 12 is connected to the body portion 35a can be freely selected, and the pattern of the resistance heating element 32 can be freely designed.

The cover member 37 supports and fixes the sealing member 17 to support and fix the electrode power supply member 35. The cover member 37 is fitted on the lower end of the protection member 13 so as to cover the sealing member 17. The cover member 37 can be formed of, for example, aluminum or the like. The cover member 37 can be fixed on the outer circumferential surface of the protection member 13. The cover member 37 can be fixed on the protection member 13 by, for example, adhesion with an adhesive or brazing or by forming screw portions in the cover member 37 and protection member 13 and screwing the same on each other. Furthermore, the cover member 37 may be fitted on the protection member with an O ring or the like between the cover member 37 and the protection member 13 to improve air tightness.

In the cover member 37, a hole into which the insulating hole 16 is inserted, a hole into which the insulating member 36 is inserted, and a hole into which the insulating tube 26 is inserted are formed. In the sealing member 17, in addition to the hole into which the insulating tube 16 is inserted, a hole into which the insulating member 36 is inserted and a hole into which the insulating tube 26 is inserted are formed. The electrode power supply member 35 and sealing member 17 may be supported and fixed by placing a support table or the like under the sealing member 17 and protection member 13 instead of the cover member 37.

With the above described plasma processing member 30, the processing object 4 can be heat treated during processing with plasma. Moreover, since the heating element power supply member 38 is accommodated in the insulating member 36, the heating element power supply member 38 can be prevented from being electrically affected by the electrode power supply member 35. It is therefore possible to prevent arcing between the electrode power supply member and the heating element power supply member.

Moreover, in the power supply member 35, the passage holes 35d and 35e, through which the insulating member 36 is passed, are formed. The heating element power supply member 38 can be therefore inserted into the electrode power supply member 35 by electrically shielding the heating element power supply member 38 with the insulating member 36. Even in the plasma processing member 30, which includes both the electrode power supply member 35 and the heating element power supply member 38, it is therefore possible to make small space required to place the electrode power supply member 35 and the heating element power supply member 38, thus preventing an increase in apparatus size of the plasma processing member 30. Accordingly, the plasma processing member 30 can be flexibly applied to plasma processing apparatuses of various configurations.

With the above described plasma processing member 30, for example, in heat treatment at high temperature of 400 to 600° C., plasma can be normally generated between the upper electrode and the plasma processing member even when the frequency of the used high frequency power is increased to 27 MHz or higher.

The plasma processing members 10, 20, and 30 shown in FIGS. 2A to 4 can be produced as follows, for example. Herein, the plasma processing member 10 shown in FIGS. 2A and 2B is described taking as an example a case where the ceramic base 11 and protection member 13 each are formed of a ceramic sintered body.

First, ceramic raw material powder containing ceramic powder as a main component, ceramic powder as a sintering additive, and the like are prepared. A binder, a dispersant, and the like are added to the ceramic raw material powder to prepare slurry when needed, and granulated powder is then produced by spray granulation or the like. The obtained granulated powder is shaped by molding, CIP, slip casting, or the like and baked under baking conditions (baking temperature, baking atmosphere, baking method, and the like) depending on the ceramic raw material powder to produce the ceramic sintered body.

Next, the plasma generating electrode 12 is formed on the ceramic sintered body. The plasma generating electrode 12 can be formed by, for example, printing with printing paste on the surface of the ceramic sintered body using screen printing or the like. Alternatively, the plasma generating electrode 12 can be formed by placing a bulk body or a sheet (foil) of the conductive material on the ceramic sintered body or forming a thin film of the conductive material on the ceramic sintered body by CVD or PVD.

Next, a ceramic molded body is formed on the ceramic sintered body and plasma generating electrode 12. For example, the ceramic sintered body with the plasma generating electrode 12 formed thereon is set in a mold or the like, and granulated powder is filled in the mold over the ceramic sintered body and plasma generating electrode 12 to form the ceramic molded body. Alternatively, a ceramic molded body may be formed of granulated powder by molding, CIP, slip casting, or the like and then placed on the ceramic sintered body for pressing.

The ceramic sintered body, plasma generating electrode 12, and ceramic molded body are integrally baked by hot pressing or the like to obtain an integrated sintered body. The ceramic base 11 with the plasma generating electrode 12 embedded can be thus produced. Concretely, the baking can be performed under the baking conditions depending on the ceramic raw material powder while being uniaxially pressed.

It is possible to produce a ceramic calcined body instead of the ceramic sintered body and form the plasma generating electrode 12 on the ceramic calcined body. Alternatively, it is possible to produce a laminated body of the ceramic sintered body, plasma generating electrode 12, and ceramic molded body and integrally bake the laminated body by hot pressing or the like.

The integrated sintered body obtained is processed. For example, drilling is performed to form a hole to which the electrode terminal 14 is inserted. The electrode terminal 14 is inserted into the formed hole, and the plasma generating electrode 12 and the electrode terminal 14 are joined to each other.

Separately, a ceramic molded body for the protection member 13 is produced by molding, CIP, slip casting, or the like using granulated powder prepared in a similar way to that of the ceramic base 11. The ceramic molded body is baked under baking conditions depending on the ceramic raw material powder, thus producing the protection member 13.

Next, the ceramic base 11 and the protection member 13 are joined to each other. For example, the ceramic base 11 and the protection member 13 are heat treated with an adhesive interposed therebetween to be joined by liquid phase bonding or solid phase bonding. Alternatively, the ceramic base 11 and the protection member 13 may be joined using a resin adhesive or the like.

The material, width w (2r), length l, and the like of the electrode power supply member 15 are adjusted as described above so that the inductance thereof when plasma is generated using high frequency power at a frequency higher than 13.56 MHz is 150 nH or less and the impedance thereof is 25Ω or less. The body portion 15a of the electrode power supply member 15 is accommodated in the housing portion 13a of the protection member 13, and the electrode terminal 14 and the electrode power supply member 15 are joined to each other.

Furthermore, the sealing member 17 is inserted from the bottom of the protection member 13 so as to cover the bottom surface of the electrode power supply member 15 and is fixed to the inner circumferential surface of the protection member 13. At this time, the external connecting portion 15e of the electrode power supply member 15 is inserted into the hole and taken out of the protection member 13.

The plasma processing member 20 shown in FIGS. 3A and 3B can be produced by a substantially same manufacturing method except additional steps of forming the hole into which the insulating tube 26 is inserted in the protection member 23 by processing, joining the insulating tube 26 to the ceramic base 11, inserting the thermocouple 28 into the ceramic base 11, and forming the passage holes 25f and 25g in the electrode power supply member 25 by processing.

Similarly, the plasma processing member 30 shown in FIG. 4 can be produced by a substantially same manufacturing method except additional steps of producing the ceramic base 11 with the resistance heating element 32 embedded, forming the hole into which the heating element terminal 33 is inserted, attaching the heating element power supply member 38, forming the passage holes 35d and 35e, into which the insulating member 36 is inserted, and attaching the cover member 37. The ceramic base 11 with the resistance heating element 32 embedded can be produced by, for example, forming a ceramic molded body with the resistance heating element 32 embedded. The present invention is not limited to the aforementioned embodiment, and various modifications can be made.

EXAMPLES

Next, the present invention is described in more detail with an example, but the present invention is not limited by the following example.

Example 1

Comparative Example 1

95 wt % of aluminum nitride powder was added with 5 wt % of yttrium oxide as a sintering agent and mixed using a ball mill. The obtained powder mixture was added with a binder and granulated by spray granulation. The obtained granulated powder was filled in a mold and uniaxially pressed to produce a molded body. The molded body was put into a carbon sheath and baked by hot pressing in nitrogen atmosphere at 1900° C., thus obtaining the ceramic sintered body.

Subsequently, powder mixture of 80 wt % of tungsten carbide and 20 wt % of aluminum nitride powder was added with ethyl cellulose as a binder to prepare the printing paste. The plasma generating electrode 12 was formed on the sintered body by screen printing and then dried.

Next, the ceramic sintered body with the plasma generating electrode 12 formed was set in a mold. Subsequently, granulated powder was filled in the mold over the ceramic sintered body and plasma generating electrode 12 and then pressed to produce the ceramic molded body. The ceramic sintered body, plasma generating electrode 12, ceramic molded body are set in a carbon sheath and baked by hot pressing in nitrogen atmosphere at 1900° C., thus producing the ceramic base 11 of the aluminum nitride sintered body.

Similar granulated powder is shaped into a pipe by CIP. The pipe-shaped molded body was baked in nitrogen gas by baking at 1900° C. at normal pressure to produce the pipe-shaped protection member 13. Concretely, the protection member 13 with a diameter of 80 mm and a length of 140 mm was produced.

A hole was formed in the ceramic base 11, and the electrode terminal 14 was inserted therein, followed by brazing of the plasma generating electrode 12 and the electrode terminal 14. Furthermore, an adhesive was applied on the rear surface 11b of the ceramic base 11 and end surface of the protection member 13 and heat treated at 1850° C. for joining by solid phase bonding.

Next, as Example 1, the electrode power supply member 15 including the cylindrical body portion 15a with the width w (diameter 2r) of 75 mm, a length of 110 mm, and the thickness t of 1 mm and the rod-shaped external connecting portion 15e with a diameter of 4.7 mm and a length of 20 mm was produced. The entire length l of the electrode power supply member 15 was 130 mm. The body portion 15a and external connecting portion 15e were both formed of nickel. Concretely, the top plate 15b, cylindrical drum portion 15c, and bottom plate 15d each were produced with a nickel plate and then welded to each other, thus producing the cylindrical body portion 15a. The body portion 15a and the external connecting portion 15e were joined to each other by brazing. The inductance and impedance of the obtained electrode power supply member 15, respectively, measured 67.21 nH and 8.61Ω by the impedance analyzer when plasma was generated using high frequency power at 27 MHz, which was higher than 13.56 MHz.

The body portion 15a of the electrode power supply member 15 of the example was inserted into the housing portion 13a of the protection member 13, and the electrode terminal 14 and the electrode power supply member 15 were joined by brazing. The plasma generating electrode 12 and the electrode power supply member 15 were thus connected through the electrode terminal 14. Furthermore, the sealing member 17 was inserted from the bottom of the protection member 13 so as to cover the bottom surface of the electrode power supply member 15 and fixed to the inner circumferential surface of the protection member 13. At this time, the external connecting portion 15e of the electrode power supply member 15 was inserted into the hole and was taken out of the protection member 13. In the above described manner, the plasma processing member 10 of the example was produced. The impedance of the obtained plasma processing member 10 measured 8.61Ω by the impedance analyzer when plasma was generated using high frequency power at 27 MHz, which was higher than 13.56 MHz.

In Comparative Example 1, a power supply rod of nickel with a diameter of 4 mm and a length of 230 mm was prepared. The plasma processing member was produced in the same manner as the above Example 1 except joining the power supply rod of the Comparative Example 1 to the electrode terminal 14. The inductance and impedance of the power supply rod measured 298.2 nH and 47.80Ω, respectively, when plasma was generated using high frequency power at 27 MHz. The impedance of the plasma processing member using the power supply rod measured 47.80Ω when plasma was generated using high frequency power at 27 MHz.

Each of the plasma processing members of the Example 1 and Comparative Example 1 was placed in the plasma processing apparatus 100 shown in FIG. 1. High frequency power at 27 MHz was then applied to the upper electrode 70 from the high frequency power supply 40 to generate plasma. In the plasma processing member 10 of the Example 1, the plasma 1 was uniformly generated normally between the upper electrode 70 and the plasma processing member 10. On the other hand, in the plasma processing member 10 of the Comparative Example 1, plasma 2 and plasma 3 are nonuniformly generated in places different from the target, such as between the upper electrode 70 and the inner wall surface of the reaction vessel 60 and under the plasma processing member.

In addition to Example 1 and Comparative Example 1 above, Examples 2 to 7 and Comparative Examples 2 and 3 shown in FIG. 6 were produced.

First, a description is given of Example 2. The power supply member was made of nickel and was columnar. The width of the power supply member was 4.0 mm, and the ratio of the length to the width (length/width) was 5.0. The inductance and impedance of the plasma processing member provided with this power supply member, respectively, measured 53.4 nH and 6.7Ω by the impedance analyzer when plasma was generated using high frequency power at 27 MHz. In Example 2, plasma was normally generated. In FIG. 6, cases where plasma was normally generated were indicated by o, and cases where plasma was not normally generated were indicated by x. In Examples 3 to 7, plasma was normally generated.

On the other hand, in each of Comparative Examples 2 and 3, the ratio of the length to the width (length/width) of the power supply member was as high as more than 16.3, and plasma was not normally generated.

The present invention is not limited by the aforementioned embodiments and example, and various modifications can be made.

What is claimed is:

1. A plasma processing member, comprising:
   a ceramic base;
   a plasma generating electrode embedded in the ceramic base; and
   an electrode power supply member comprising a body portion, a top plate of the body portion, a bottom plate of the body portion and an external connecting portion joined to the body portion, wherein the body portion is connected to the plasma generating electrode, and wherein the body portion is hollow and has a diameter of 20 mm-80 mm;
   an electrode terminal embedded in the ceramic base and connecting the plasma generating electrode and the body portion of the electrode power supply member;
   a protection member formed of ceramic and including a housing portion accommodating the body portion of the electrode power supply member wherein the housing portion is joined to the ceramic base;
   a resistance heating element embedded in the ceramic base;
   a heating element power supply member connected to the resistance heating element; and
   an insulating member formed of ceramic and including a housing portion accommodating the heating element power supply member,
   wherein the body portion of the electrode power supply member is accommodated in the housing portion of the protection member, the external connecting portion of the electrode power supply member extends out of the protection member,
   a first passage hole formed in the top plate of the body portion, and
   a second passage hole formed in the bottom plate of the body portion,
   the insulating member and the heating element power supply member are passed through the first passage hole, the hollow body portion of the electrode power supply member, and the second passage hole;
   the impedance of the plasma processing member is not more than 25Ω when plasma is generated using high frequency power at a frequency of at least 27 MHz, and
   the electrode power supply member has an inductance of not more than 150 nH when plasma is generated using high frequency power at a frequency of at least 27 MHz.

2. The plasma processing member according to claim 1, wherein the plasma generating electrode and the electrode terminal are connected to each other by caulking, welding, brazing, soldering, fitting, or screwing, and the electrode terminal and the body portion of the electrode power supply member are connected to each other by caulking, welding, brazing, soldering, fighting, or screwing.

* * * * *